United States Patent
Wakasa

(10) Patent No.: US 8,631,194 B2
(45) Date of Patent: Jan. 14, 2014

(54) DRAM REFRESH SCHEDULE CONTROL MODULE

(75) Inventor: Takahiro Wakasa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 169 days.

(21) Appl. No.: 13/007,557

(22) Filed: Jan. 14, 2011

(65) Prior Publication Data

US 2011/0197020 A1  Aug. 11, 2011

(30) Foreign Application Priority Data

Feb. 8, 2010 (JP) ................................. 2010-025211

(51) Int. Cl.
*G06F 12/00* (2006.01)
(52) U.S. Cl.
USPC ........................................................ 711/106
(58) Field of Classification Search
USPC .................................. 711/104–106; 365/222
See application file for complete search history.

(56) References Cited

U.S. PATENT DOCUMENTS

| | | | | |
|---|---|---|---|---|
| 6,313,844 | B1* | 11/2001 | Yamashita | 345/531 |
| 8,122,188 | B2* | 2/2012 | Sohn et al. | 711/106 |
| 2001/0040827 | A1* | 11/2001 | Dosaka et al. | 365/189.01 |
| 2006/0239106 | A1* | 10/2006 | Kawabata et al. | 365/230.03 |
| 2006/0262625 | A1* | 11/2006 | Dono et al. | 365/222 |
| 2007/0022245 | A1* | 1/2007 | Sohn et al. | 711/106 |
| 2007/0121771 | A1* | 5/2007 | Yamada | 375/362 |
| 2007/0126850 | A1* | 6/2007 | Tsuji | 347/232 |
| 2008/0151670 | A1* | 6/2008 | Kawakubo et al. | 365/222 |
| 2008/0175071 | A1* | 7/2008 | Lee et al. | 365/189.04 |
| 2009/0201526 | A1* | 8/2009 | Kikuyama | 358/1.14 |
| 2011/0292448 | A1* | 12/2011 | Ohashi | 358/1.16 |

FOREIGN PATENT DOCUMENTS

JP  2007-233633  2/2006

OTHER PUBLICATIONS

Heath, Steve. "DRAM Refresh Techniques" in: Embedded Systems Design (Jordan Hill GBR,Newnes, 2002), pp. 88.*
Heath, Steve. "DRAM Refresh Techniques" in: Embedded Systems Design (Jordan Hill GBR, Newnes, 2002), pp. 88.*
Ghosh et al., "Smart Refresh: An Enhanced Memory Controller Design for Reducing Energy in Conventional and 3D Die-stacked DRAMs", © 2007 IEEE, p. 134-145.*

* cited by examiner

*Primary Examiner* — Brian Peugh
(74) *Attorney, Agent, or Firm* — Maschoff Brennan

(57) ABSTRACT

An electronic device includes a memory control circuit that controls a DRAM, and the memory control circuit performs: a first distributed refresh process for issuing refresh commands to the DRAM at a predetermined interval so that storage elements of which the DRAM is configured are refreshed at least once in a predetermined period Ts; a concentrated refresh process for issuing, triggered by a predetermined request to the DRAM, a predetermined number of times Nc of the refresh commands in a burst at an interval that is shorter than the predetermined interval; and a second distributed refresh process for, when the predetermined number of times Nc of refresh commands have been issued, calculating a refresh interval Tr for refreshing remaining storage elements that have not yet been refreshed in the predetermined period Ts and issues refresh commands at the calculated refresh interval Tr.

8 Claims, 6 Drawing Sheets

DRAM REFRESH SCHEDULE CONTROL MODULE

BACKGROUND

1. Technical Field

The present invention relates to electronic devices.

2. Related Art

Because stored content disappears from a DRAM (Dynamic RAM) if that DRAM is not accessed for a certain amount of time, it is necessary to update (hereinafter, "refresh") the stored content at a set cycle (JP-A-2007-233633 and so on). For example, in the case where all of the cells (storage regions) of which a DRAM is configured are to be refreshed within a predetermined period (64 ms), it is necessary for a controller that controls the DRAM to issue a refresh command to the DRAM an average of once every 7.8 µs (when there are 8,192 cells or columns).

However, it is not absolutely necessary to carry out a refresh once every 7.8 µs; on the contrary, the refresh interval can be set freely as long as all of the cells are ultimately refreshed within the predetermined period (64 ms). Hereinafter, performing refreshes at equal intervals will be called "distributed refreshing", whereas performing refreshes in a concentrated manner in shorter period of time than the distributed refreshing will be called "concentrated refreshing".

Incidentally, the aforementioned refresh operations require a comparatively long time, and because the DRAM cannot be accessed during that time, the performance of the DRAM is affected greatly by the timing of the refresh operations.

SUMMARY

An advantage of some aspects of the invention is to provide a technique for preventing a drop in DRAM performance caused by refresh operations.

An electronic device according to an aspect of the invention includes a memory control circuit that controls a DRAM, and the memory control circuit performs: a first distributed refresh process for issuing refresh commands to the DRAM at a predetermined interval so that storage elements of which the DRAM is configured are refreshed at least once in a predetermined period Ts; a concentrated refresh process for issuing, triggered by a predetermined request to the DRAM, a predetermined number of times Nc of the refresh commands in a burst at an interval that is shorter than the predetermined interval; and a second distributed refresh process for, when the predetermined number of times Nc of refresh commands have been issued, calculating a refresh interval Tr for refreshing remaining storage elements that have not yet been refreshed in the predetermined period Ts and issues refresh commands at the calculated refresh interval Tr.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereafter, an exemplary embodiment of the invention will be described with reference to the drawings.

Figure 1:
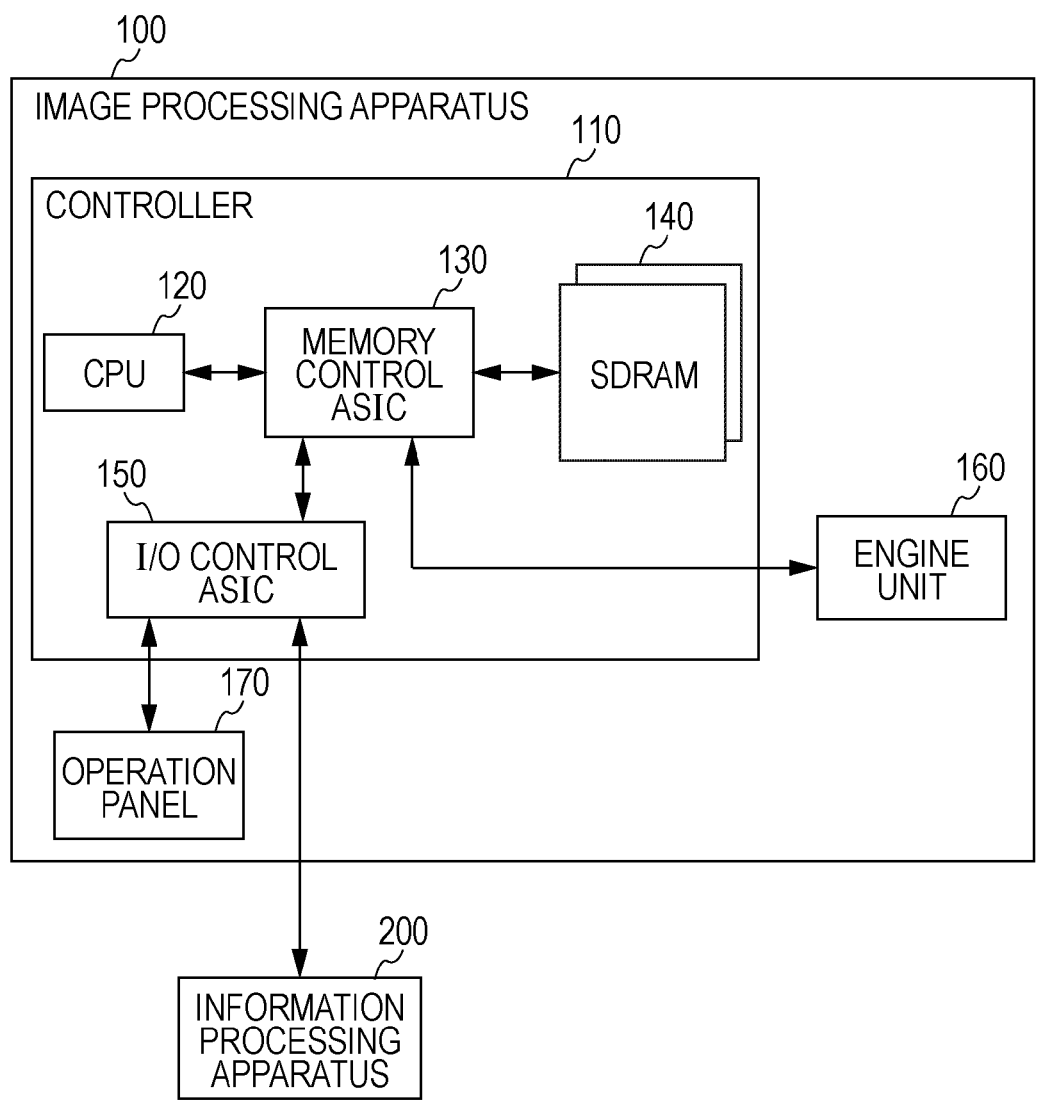
FIG. 1 is a diagram illustrating an example of the hardware configuration of an image processing apparatus according to the embodiment of the invention.

FIG. 1 is a diagram illustrating an example of the hardware configuration of an image processing apparatus 100 according to the embodiment of the invention. The image processing apparatus 100 is an apparatus such as a printer, a copier, a multi-function peripheral, a scanner, or the like. The image processing apparatus 100 is connected to an information processing apparatus 200.

The information processing apparatus 200 is implemented as a typical computer that includes a CPU, a RAM, a ROM, an auxiliary storage device such as a hard disk, a display, input devices such as a keyboard and a mouse, a communication interface, and so on (not shown). The information processing apparatus 200 executes application programs, driver programs (for example, a printer driver program), and the like.

The image processing apparatus 100 includes a controller 110 serving as an electronic device control unit that controls various processes performed by the image processing apparatus 100, an engine unit 160 that executes printing onto a print medium, the reading of original documents, and so on, and an operation panel 170 serving as an input/output interface with a user.

The controller 110 includes a CPU 120, a memory control ASIC 130, an SDRAM 140, and an I/O (Input/Output) control ASIC 150. The controller 110 implements printing functions, facsimile functions, scanner functions, copier functions, and so on including various image processes by controlling the various mechanisms such as the engine unit 160 and the operation panel 170. However, the controller 110 is not limited to this configuration, and for example, the CPU 120 may be provided in the memory control ASIC 130.

The CPU 120 executes various processes by accessing the SDRAM 140 via the memory control ASIC 130 and reading/writing various types of data. The CPU 120 issues an access request for accessing the SDRAM 140 to the memory control ASIC 130.

The memory control ASIC 130 controls the access performed by the CPU 120, the I/O control ASIC 150, and the engine unit 160 to the SDRAM 140. The memory control ASIC 130 may control direct memory access to the SDRAM 140, which does not go through the CPU 120.

Meanwhile, the memory control ASIC 130 issues refresh commands for refreshing the SDRAM 140.

The SDRAM 140 is a memory that is controlled by the memory control ASIC 130. The SDRAM 140 has multiple cells (storage regions) and refreshes cells (or columns) that are to be refreshed when a refresh command is issued by the memory control ASIC 130.

The I/O control ASIC 150 controls the exchange of data with an external device (the operation panel 170, the information processing apparatus 200, or the like).

The engine unit 160 includes a paper supply/discharge mechanism, printing mechanism, scanning mechanism, and so on for realizing a printing function, a facsimile function, a scanner function, a copier function, and so on, and includes, for example, a printing engine, a scanner engine, and the like.

The operation panel 170 is a unit for accepting user operations. The operation panel 170 includes, for example, a display such as an LCD and a touch panel provided on the display surface of the display. The operation panel 170 may include various types of physical switches such as buttons, keys, or the like.

The foregoing describes the hardware configuration of the image processing apparatus 100. Of course, this configuration is illustrative only of the primary configuration as required to describe features of the invention, and is not limited to the configuration described above. The descriptions are furthermore not intended to exclude other configurations that a typical image processing apparatus 100 includes.

Figure 2:
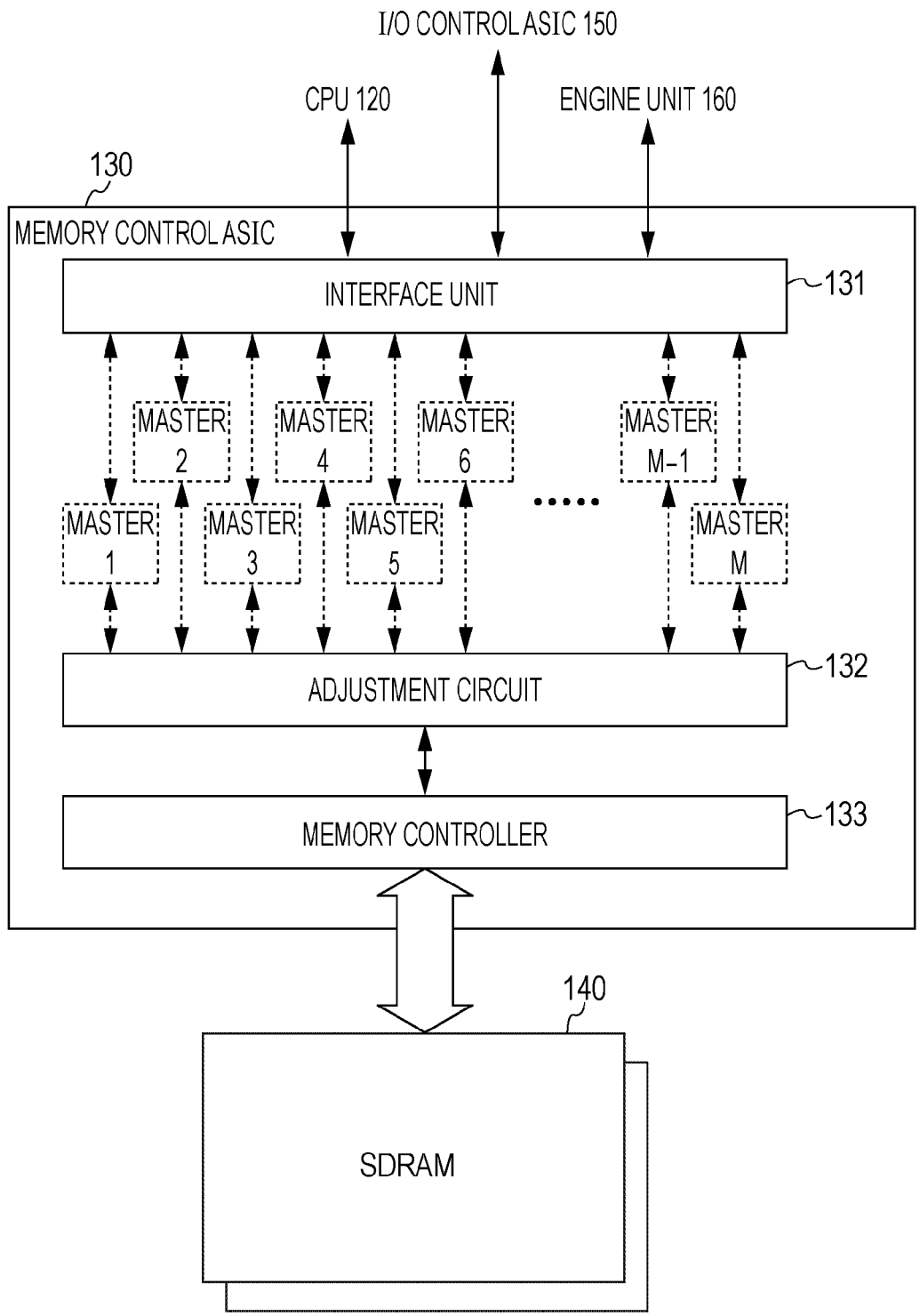
FIG. 2 is a diagram illustrating an example of the hardware configuration of a memory control ASIC.

FIG. 2 is a diagram illustrating an example of the hardware configuration of the memory control ASIC 130. As shown in FIG. 2, the memory control ASIC 130 includes an interface unit 131, an adjustment circuit 132, and a memory controller 133.

The interface unit 131 accepts access requests from the CPU 120, the I/O control ASIC 150, and the engine unit 160, and notifies the adjustment circuit 132 of these requests.

The adjustment circuit 132 accepts the notified access requests and notifies the memory controller 133 of those access requests. Here, in the case where the adjustment circuit 132 has accepted multiple access requests at the same time, the adjustment circuit 132 is controlled so as to select a single access request and notifies the memory controller 133 of that access request.

Upon accepting an access request from the adjustment circuit 132, the memory controller 133 issues a predetermined command to the SDRAM 140 and carries out access control based on the access request.

Furthermore, the memory controller 133 refreshes the SDRAM 140 by issuing a refresh command to the SDRAM 140.

Here, the memory controller 133 can refresh the SDRAM 140 using any of multiple control methods. In other words, the memory controller 133 refreshes the SDRAM 140 using the "distributed refreshing", "concentrated refreshing", or "dual refreshing" control method.

Distributed Refreshing

Specifically, in the case where a distributed refresh mode has been set, the memory controller 133 issues a refresh command to the SDRAM 140 at equal intervals.

Figure 3:
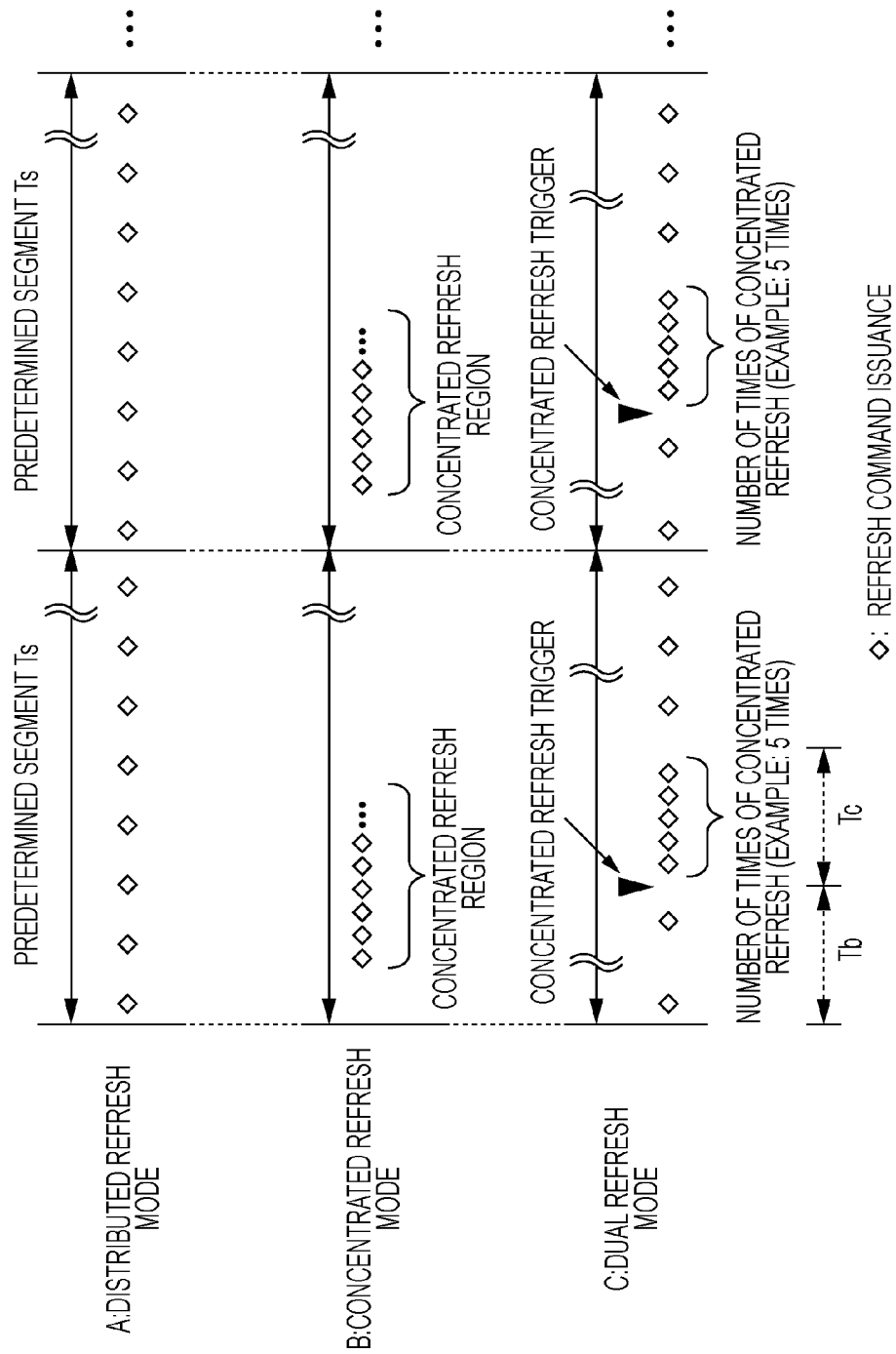
FIG. 3 is a diagram illustrating an example of the timing at which a refresh command is issued in a distributed refresh mode; an example of the timing at which a refresh command is issued in a concentrated refresh mode; and an example of the timing at which a refresh command is issued in a dual mode.

Section A of FIG. 3 is a diagram illustrating an example of the timing at which refresh commands are issued in the distributed refresh mode. As illustrated in Section A of FIG. 3, the memory controller 133 issues refresh commands at an equal interval so that the cells of which the SDRAM 140 is configured are refreshed at least once during a predetermined segment (period) Ts. The interval at which the refresh command is issued in the distributed refresh mode is set to a value obtained by, for example, dividing the predetermined segment (period) Ts by the total number of times Ns of issuances necessary to refresh all of the cells (or a predetermined unit of cells) of which the SDRAM 140 is configured (that is, Ts/Ns). Note that the predetermined segment (period) Ts mentioned here is a period in which stored content can be held without a refresh, and is assumed to be a period compliant with a predetermined standard (such as a standard defined by the JEDEC (Joint Electron Device Engineering Council)).

Concentrated Refreshing

Meanwhile, in the case where the concentrated refresh mode has been set, the memory controller 133 issues refresh commands to the SDRAM 140 in a burst at an interval that is shorter than the interval at which the refresh commands are issued in the distributed refresh mode (Ts/Ns).

Section B of FIG. 3 is a diagram illustrating an example of the timing at which refresh commands are issued in the concentrated refresh mode. As illustrated in Section B of FIG. 3, the memory controller 133 issues refresh commands in a burst in a predetermined region in the predetermined segment (period) Ts (a "concentrated refresh region", as shown in Section B of FIG. 3). The number of times of refresh commands issued in this predetermined region is the total number of times of issuances Ns necessary to refresh all of the cells (or a predetermined unit of cells) of which the SDRAM 140 is configured. Accordingly, the interval at which the refresh commands are issued in the concentrated refresh mode is by nature a shorter interval than the interval at which the refresh commands are issued in the distributed refresh mode (Ts/Ns). Note that it is desirable for this interval to be as short an interval as possible within the range in which refresh commands can be issued.

Dual Refreshing

Finally, in the case where the combined refreshing has been set, the memory controller 133 issues refresh commands to the SDRAM 140 using both distributed refreshing and concentrated refreshing. In other words, the memory controller 133 carries out distributed refreshing (the issuing of refresh commands at an equal interval) until a predetermined request (an access request) is made to the SDRAM 140, and then carries out concentrated refreshing (the issuing of refresh commands in a burst at a shorter interval than that used in distributed refreshing), triggered by the predetermined request (access request) made to the SDRAM 140.

Section C of FIG. 3 is a diagram illustrating an example of the timing at which refresh commands are issued in the dual refresh mode.

As illustrated in Section C of FIG. 3, at the start of the predetermined segment (period) Ts, the memory controller 133 issues refresh commands at an interval that is the same as the interval at which refresh commands are issued in the distributed refresh mode (Ts/Ns).

Then, when a predetermined request (access request) is made to the SDRAM 140, the memory controller 133 starts concentrated refreshing, triggered by the request (the "concentrated refresh trigger" illustrated in Section C of FIG. 3). When a predetermined number of times (five, in the example shown in Section B of FIG. 3) Nc of refresh commands has been issued following the start of concentrated refreshing, the memory controller 133 ends concentrated refreshing.

Here, in the period Tc from when concentrated refreshing is started to when concentrated refreshing ends, refresh commands are issued at the same interval as the interval at which refresh commands are issued in the concentrated refresh mode, and thus the period Tc is equivalent to (interval at which refresh commands are issued in the concentrated refresh mode)×Nc. In other words, the memory controller 133 carries out concentrated refreshing until the period Tc has elapsed following the concentrated refresh trigger.

The reason for doing so is that once a predetermined request (access request) has been made, it is almost certain that an access request will not be made to the SDRAM 140 for the set period Tc. Carrying out concentrated refreshing during this period Tc makes it possible to reduce the likelihood that an access request will occur during refreshing throughout the entire predetermined segment (period) Ts, and as a result, a drop in the performance of the SDRAM 140 can be prevented.

Meanwhile, when concentrated refreshing ends, the memory controller 133 issues refresh commands at an equal interval Tr in order to refresh the remaining cells (storage regions) that have not yet been refreshed in the predetermined segment (period) Ts.

In order to do this, the memory controller 133 first calculates, upon the concentrated refreshing ending, a time (Ts−Tb−Tc) until the predetermined segment (period) Ts will end, and the number of times Nr of refresh commands necessary for the remaining cells (storage regions) that have not yet been refreshed in the predetermined segment (period) Ts. Here, Nr can be found by subtracting the number of times Nb of refresh commands issued at an equal interval from when the predetermined segment (period) Ts starts to when concentrated refreshing starts and the number of times Nc (five, in the example shown in Section C of FIG. 3) of refresh commands issued from when concentrated refreshing starts to when concentrated refreshing ends from the total number of times of issuances Ns of the refresh commands necessary to refresh all of the cells (or a predetermined unit of cells) of which the SDRAM 140 is configured (in other words, Nr=Ns−Nb−Nc).

Next, the memory controller 133 calculates the interval (equal interval) Tr at which to issue refresh commands from when concentrated refreshing ends to when the predetermined segment (period) Ts ends by dividing the calculated time (Ts−Tb−Tc) by the calculated number of times Nr (in other words, Tr=(Ts−Tb−Tc)/Nr) of issuance.

After this, the memory controller 133 issues refresh commands at the calculated interval Tr until the predetermined segment (period) Ts ends. Accordingly, with this dual refresh mode, all of the cells (storage regions) of which the SDRAM 140 is configured can be refreshed within the predetermined segment (period) Ts.

Note that at least one of an image read request, a color correction request, and a screen processing request is included as the stated concentrated refresh trigger.

The memory controller 133 repeatedly issues the refresh commands using the stated timings in the distributed refresh mode, the concentrated refresh mode, and the dual refresh mode, using the predetermined segment (period) Ts as a single unit.

The foregoing has described the configurations of the controller 110, the memory control ASIC 130, and so on. Of course, these configurations are illustrative only of the primary configurations as required to describe features of the invention, and are not limited to the configurations described above. The descriptions are furthermore not intended to exclude other configurations that a typical controller 110, memory control ASIC 130, or the like include.

Next, characteristic operations of the aforementioned memory controller 133 will be described.

Figure 4:
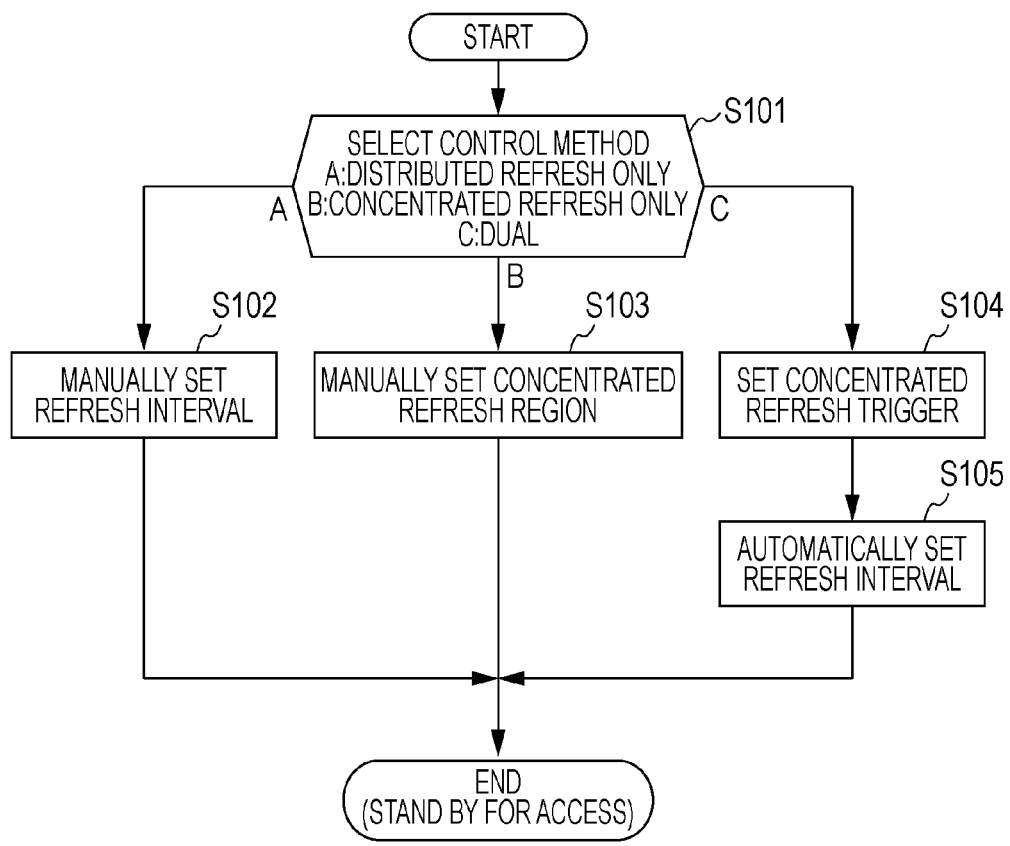
FIG. 4 is a flowchart illustrating a process for setting a refresh mode.

FIG. 4 is a flowchart illustrating a process for setting a refresh mode.

The memory controller 133 starts the refresh mode setting process when, for example, the image processing apparatus 100 is turned on. Of course, the timing at which this flow is started is not intended to be limited to this timing, and may be started when the image processing apparatus 100 is shipped, at a timing instructed by a user, and so on.

When the refresh mode setting process starts, the memory controller 133 selects the control method by which to refresh the SDRAM 140 (step S101). For example, the memory controller 133 displays a screen in the operation panel 170 that allows the selection of the refresh control method, and accepts an instruction from a user selecting the control method. Note that the selectable control methods include, as described above, "A: distributed refresh mode", "B: concentrated refresh mode", and "C: dual refresh mode".

If an instruction that selects "A: distributed refresh mode" has been accepted in step S101 (step S101: A), the memory controller 133 advances the process to step 102, where the "distributed refresh mode" is set (manually set) (step S102).

To be more specific, the memory controller 133 accepts, from the user, the period for which the stored content of the cells in the SDRAM 140 can be held without refreshing (the stated predetermined segment Ts) and the total number times Ns of issuances necessary to refresh all of the cells (or a predetermined unit of cells) of which the SDRAM 140 is configured. Then, the memory controller 133 calculates the interval (equal interval) at which to issue refresh commands using the accepted values (Ts and Ns) (in other words, calculates Ts/Ns). The memory controller 133 then stores the accepted values (Ts and Ns) and the calculated refresh interval (Ts/Ns) in a predetermined storage region (for example, a register) as the distributed refresh mode setting values.

Of course, the stated predetermined segment Ts and the total number of times Ns of issuances for refreshing may be preregistered, and only the interval for the issuance of refresh commands in the distributed refresh mode (Ts/Ns) may be calculated in step S102 as well.

After this, the memory controller 133 ends the flow and stands by for an access request, and starts the issuance of refresh commands in the distributed refresh mode based on the setting values set in step S102.

On the other hand, if an instruction that selects "B: concentrated refresh mode" has been accepted in step S101 (step S101: B), the memory controller 133 advances the process to step 103, where the "concentrated refresh mode" is set (manually set) (step S103).

Figure 5:
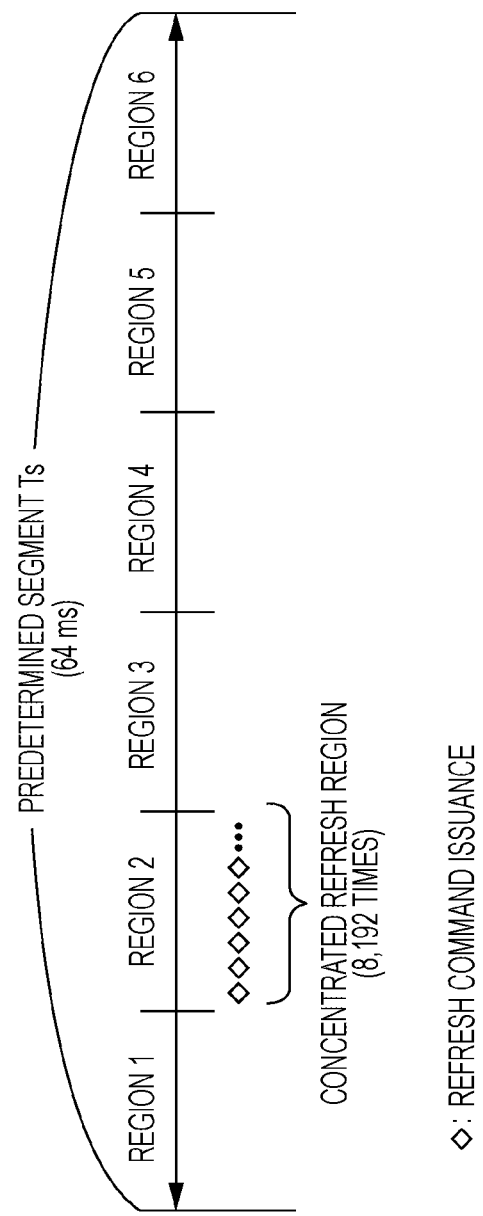
FIG. 5 is a diagram illustrating a process for setting a concentrated refresh mode.

FIG. 5 is a diagram illustrating a process for setting the "concentrated refresh mode". As shown in FIG. 5, the memory controller 133 accepts, from the user, the period for which the stored content of the cells in the SDRAM 140 can be held without refreshing (the stated predetermined segment Ts) and the total number of times Ns issuances necessary to refresh all of the cells (or a predetermined unit of cells) of which the SDRAM 140 is configured. Then, the memory controller 133 accepts a specification of a region on which to carry out concentrated refreshing (the concentrated refresh region). For example, the memory controller 133 divides the accepted period Ts into multiple regions (six divisions, in the example shown in FIG. 5), and accepts, from the user, an instruction selecting a single region from the regions obtained through the division (a "region 2", in the example shown in FIG. 5). The memory controller 133 then stores the accepted values (Ts and Ns) and the selected concentrated refresh region in a predetermined storage region (for example, a register) as the concentrated refresh mode setting values.

Of course, the stated predetermined segment Ts and the total number of times Ns of issuances for refreshing may be pre-registered.

After this, the memory controller 133 ends the flow and stands by for an access request, and starts the issuance of refresh commands in the concentrated refresh mode based on the setting values set in step S103. In other words, the memory controller 133 stands by for an access request, and does not issue a refresh command until the concentrated refresh region set in step S103; the memory controller 133 then issues a burst of refresh commands equivalent to the total number of times Ns of issuances set in step S103 when the concentrated refresh region is reached.

Finally, if an instruction that selects "C: dual refresh mode" has been accepted in step S101 (step S101: C), the memory controller 133 advances the process to step 104, where the "dual refresh mode" is set (automatically set) (step S104, step S105).

Figure 6:
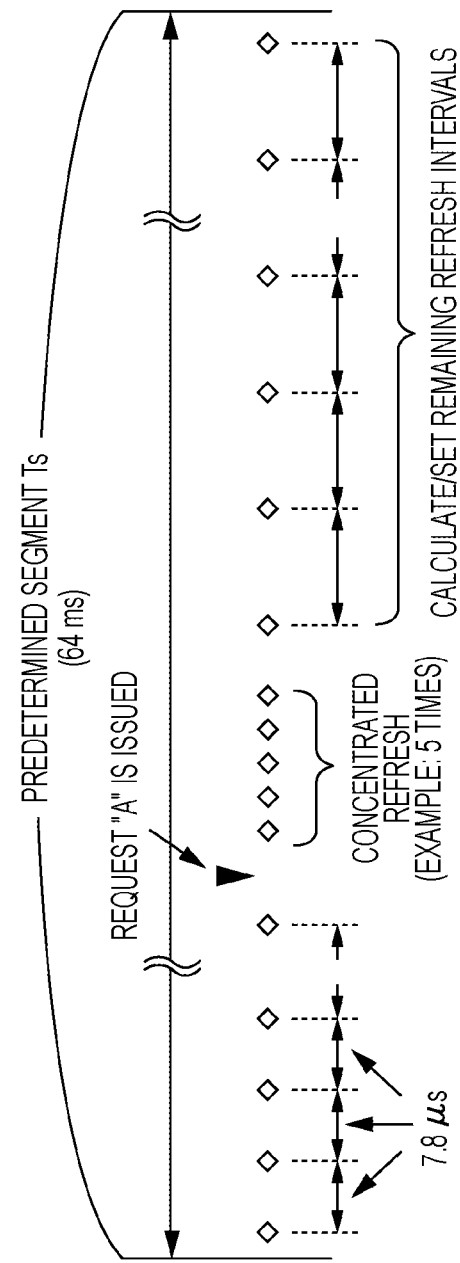
FIG. 6 is a diagram illustrating a process for setting a dual mode.

FIG. 6 is a diagram illustrating a process for setting the "dual refresh mode". As illustrated in FIG. 6, first, the memory controller 133 sets a concentrated refresh trigger that is to serve as the trigger for starting concentrated refreshing (step S104). For example, the memory controller 133 accepts a specification of at least one request (an image read request, a color correction request, a screen processing request) from the user and sets the accepted request as the concentrated refresh trigger (stores the request in a predetermined storage region).

Next, the memory controller 133 sets the refresh interval to be used until concentrated refreshing is carried out (step S105). To be more specific, the memory controller 133 accepts, from the user, the period for which the stored content of the cells in the SDRAM 140 can be held without refreshing (the stated predetermined segment Ts) and the total number of times Ns of issuances necessary to refresh all of the cells (or a predetermined unit of cells) of which the SDRAM 140 is configured. Then, the memory controller 133 calculates, using the accepted values (Ts and Ns), the interval (equal interval) at which to issue refresh commands until the request that was set as the concentrated refresh trigger occurs (specifically, calculates Ts/Ns). The memory controller 133 then stores the accepted values (Ts and Ns) and the calculated refresh interval (Ts/Ns) in a predetermined storage region (for example, a register) as the dual refresh mode setting values.

Of course, the stated predetermined segment Ts and the total number of times Ns of issuances for refreshing may be preregistered, and only the interval for the issuance of refresh commands until concentrated refreshing occurs (Ts/Ns) may be calculated in step S105 as well.

Meanwhile, the memory controller 133 sets the number of times refresh command issued after the start of concentrated refreshing; specifically, the memory controller 133 accepts, from the user, the number of times Nc of issuances of refresh commands in the concentrated refreshing, and stores that number of times in a predetermined storage region (for example, a register) as the setting value of the dual refresh mode.

After this, the memory controller 133 ends the flow and stands by for an access request, and starts issuing refresh commands in the dual refresh mode based on the setting values set in step S104 and step S105. In other words, the memory controller 133 stands by for an access request, and issues refresh commands according to distributed refreshing until a request serving as the concentrated refresh trigger set in step S104 occurs. When the request set as the concentrated refresh trigger occurs, concentrated refreshing is started, and a burst of refresh commands equivalent to the number of times Nc of issuance set in step S105 is issued.

Furthermore, as mentioned earlier, when concentrated refreshing ends, the memory controller 133 refreshes the remaining cells (storage regions) not yet refreshed in the period set in step S105 (that is, the predetermined period Ts). To that end, the memory controller 133 calculates, when concentrated refreshing ends, the interval (equal interval) Tr at which to issue the refresh commands by the end of the period set in step S105 (the predetermined period Ts) (the calculation is the aforementioned Tr=(Ts−Tb−Tc)/Nr), and issues the refresh commands in the calculated interval Tr until the period set in step S105 (the predetermined period Ts) ends.

Through the aforementioned processing, the SDRAM 140 can be refreshed through one of the aforementioned modes, or the "distributed refresh mode", "concentrated refresh mode", and "dual refresh mode", and thus it is possible to carry out optimal refreshing in accordance with the manner in which the user uses the apparatus. Meanwhile, in the case where the dual refresh mode has been set, the period Tc in which it is certain that no access requests will be made to the SDRAM 140 follows the occurrence of the request set in step S104, and concentrated refreshing is performed during that period Tc; accordingly, the likelihood that an access request will occur during refreshing throughout the predetermined segment (period) Ts can be reduced.

Note that the processing units of each flow described above have been broken down according to the primary processing content in order to facilitate understanding of the memory controller 133. The invention is not intended to be limited by the method for classifying the processing steps and the naming thereof. The processing carried out by the memory controller 133 may be further divided into more processing steps. Further, a single processing step may execute more processes.

The aforementioned embodiment is intended to illustrate an example of the spirit of the invention, and is not intended to limit the invention in any way. Many substitutions, modifications, and variations will be apparent to those skilled in the art.

For example, the memory controller 133 may change the setting values set for the distributed refresh mode (step S102), the concentrated refresh mode (step S103), and the dual refresh mode (step S104 and step S105) in each period for which the stored content of the cells in the SDRAM 140 can be held without refreshing (that is, the aforementioned predetermined segment Ts).

Specifically, in the case where the "distributed refresh mode" has been set, in step S102, multiple setting values may be registered for the setting values (Ts, Ns) and the setting value may be changed to one of the registered setting values each time the segment (period) Ts ends. Likewise, in the case where the "concentrated refresh mode" has been set, in step S103, multiple setting values may be registered for the setting values (concentrated refresh region, Ts, Ns) and the setting value may be changed to one of the registered setting values each time the segment (period) Ts ends. Furthermore, in the case where the "dual refresh mode" has been set, in step S104 and step S105, multiple setting values may be registered for the setting values (concentrated refresh trigger, Ts, Ns, the number of times Nc of concentrated refresh) and the setting value may be changed to one of the registered setting values each time the segment (period) Ts ends.

Meanwhile, the memory controller 133 may, in the "dual refresh mode", change the number of times Nc of concentrated refresh based on the type of the request that has occurred (the concentrated refresh trigger).

To be specific, in the case where the "dual refresh mode" has been set, in step S104, multiple setting values are registered for the concentrated refresh trigger and the number of times Nc of concentrated refresh. Then, for example, in the case where a first request (concentrated refresh trigger) has occurred, the memory controller 133 may carry out concentrated refreshing the number of times Nc of a first concentrated refresh, and in the case where a second request (concentrated refresh trigger) that differs from the first request has occurred, the memory controller 133 may carry out concentrated refreshing the number of times Nc of a second concentrated refresh that differs from the number of times Nc of the first concentrated refresh.

In addition, in the aforementioned step S104, in the case where multiple requests (an image read request, a color correction request, a screen processing request, and the like) have been set as concentrated refresh triggers, the memory controller 133 may carry out concentrated refreshing each time one of those requests occurs in the period (predetermined segment Ts) set in step S105 (that is, when refresh commands occur the number of times Nc of the same concentration issuance). In this case as well, the interval (equal interval) Tr at which to issue refresh command by the end of the period (predetermined period Ts) set in step S105 is calculated each time concentrated refreshing ends, and refresh commands are thereafter issued using the calculated interval Tr.

The aforementioned embodiment describes the SDRAM 140 as the memory controlled by the memory control ASIC 130. However, the invention is not intended to be limited thereto, and can be applied in any memory that requires refreshing in a set cycle, such as a DRAM, an SDRAM (SDR, DDR, DDR2, DDR3), or the like.

The entire disclosure of Japanese Patent Application No. 2010-025211, filed Feb. 8, 2010 is expressly incorporated by reference herein.

What is claimed is:

1. An electronic device comprising a memory control circuit that controls a DRAM,
wherein the memory control circuit performs:
a first distributed refresh process for issuing refresh commands to the DRAM at a predetermined interval so that storage elements of which the DRAM is configured are refreshed at least once in a predetermined period Ts;
a concentrated refresh process for issuing, triggered by a predetermined request which is different from refresh commands to the DRAM, a predetermined number of times Nc of burst refresh commands in a burst having been issued in the concentrated refresh process at an interval in the predetermined period Ts that is shorter than the predetermined interval; and
a second distributed refresh process for, when the predetermined number of times Nc of refresh commands have been issued and a concentrated refresh process has been performed in the predetermined period Ts, calculating a refresh interval Tr for refreshing remaining storage elements to the DRAM that have not yet been refreshed in the predetermined period Ts and issues refresh commands at the calculated refresh interval Tr.

2. The electronic device according to claim 1,
wherein in the second distributed refresh process, the refresh interval Tr is calculated using $Nr=Ns-Nb-Nc$ and $Tr=(Ts-Tb-Tc)/Nr$,
where Ns is the total predetermined number of times it is necessary to issue a refresh command in order to refresh the storage elements of which the DRAM is configured at least once within the predetermined period Ts, Nb is the number of times a refresh command is issued in the first distributed refresh process, Nc is the number of times a refresh command is issued in the concentrated refresh process, Nr is the number of times it is necessary to issue a refresh command in order to refresh the remaining storage elements that have not yet been refreshed in the predetermined period Ts, Tb is the time required to issue refresh commands in the first distributed refresh process, and Tc is the time required to issue refresh commands in the concentrated refresh process.

3. The electronic device according to claim 1,
wherein the memory control circuit changes the set values regarding the issuance o refresh commands in the first distributed refresh process, the concentrated refresh process, and the second distributed refresh process each time the predetermined period Ts passes.

4. The electronic device according to claim 1, wherein in the concentrated refresh process, the number of times Nc that a refresh command is issued is changed based on the type of request to the DRAM.

5. The electronic device according to claim 1, wherein in the concentrated refresh process, the same predetermined number Nc of refresh commands is issued, triggered by multiple types of requests to the DRAM.

6. The electronic device according to claim 1,
wherein the electronic device is an image reading apparatus; and
in the concentrated refresh process, the refresh commands are issued in a burst, triggered by an image read request.

7. The electronic device according to claim 1,
wherein the electronic device is a printing apparatus; and
in the concentrated refresh process, the refresh commands are issued in a burst, triggered by at least one of a color correction request and a screen process request.

8. The electronic device according to claim 1,
wherein the memory control circuit:
issues refresh commands consistently at the predetermined interval during the predetermined period Ts in the case where a first mode has been set;
issues the total number of times Ns that refresh commands are to be issued in a burst at a predetermined timing within the predetermined period Ts, in the case where a second mode has been set; and
performs the first distributed refresh process, the concentrated refresh process, and the second distributed refresh process in the case where a third mode has been set.

* * * * *